(12) United States Patent
Wang et al.

(10) Patent No.: US 11,535,462 B2
(45) Date of Patent: Dec. 27, 2022

(54) TRANSFER DEVICE, TRANSFER METHOD AND VACUUM EVAPORATION DEVICE

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Zhen Wang, Beijing (CN); Zhiming Lin, Beijing (CN); Chun Chieh Huang, Beijing (CN); Yu Jing, Beijing (CN); Wenze Wu, Beijing (CN)

(73) Assignees: BEIJING BOE TECHNOLOGY DEVELOPMENT CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 1209 days.

(21) Appl. No.: 16/068,493

(22) PCT Filed: Dec. 15, 2017

(86) PCT No.: PCT/CN2017/116469
§ 371 (c)(1),
(2) Date: Jul. 6, 2018

(87) PCT Pub. No.: WO2018/176918
PCT Pub. Date: Oct. 4, 2018

(65) Prior Publication Data
US 2021/0163238 A1   Jun. 3, 2021

(30) Foreign Application Priority Data

Mar. 31, 2017 (CN) .......................... 201710209599.3

(51) Int. Cl.
B65G 49/06 (2006.01)
C23C 14/24 (2006.01)

(52) U.S. Cl.
CPC ......... B65G 49/064 (2013.01); B65G 49/061 (2013.01); *B65G 2207/10* (2013.01); *C23C 14/24* (2013.01)

(58) Field of Classification Search
CPC .... B65G 49/06; B65G 49/061; B65G 49/063; B65G 49/064; B65G 2201/022; B65G 2207/10; C23C 14/24; C23C 14/564
See application file for complete search history.

(56) References Cited

U.S. PATENT DOCUMENTS 7,335,090 B2 *  2/2008  Takahashi ......... H01L 21/67766
                                                          451/28
10,386,661 B2 *  8/2019  Xu ........................ G02F 1/1303
(Continued)

*Primary Examiner* — Gene O Crawford
*Assistant Examiner* — Keith R Campbell

(57) ABSTRACT

A transfer device including at least one first transfer component and at least one second transfer component are provided. The first transfer component includes a first carrier pad contacting the transferred object, and the second transfer component includes a second carrier pad contacting the transferred object, and material of the first carder pad has stronger capability to capture electrons than that of the second carrier pad and material of the second carrier pad has stronger capability to lose electrons than that of the first carder pad.

19 Claims, 4 Drawing Sheets

(56) References Cited

U.S. PATENT DOCUMENTS

2005/0001438 A1* 1/2005 Lee .................. H01L 21/67742
                                                                         294/213
2006/0208201 A1* 9/2006 Hosokawa ............... G21K 5/02
                                                                       250/492.1

* cited by examiner

TRANSFER DEVICE, TRANSFER METHOD AND VACUUM EVAPORATION DEVICE

CROSS REFERENCE TO RELATED APPLICATIONS

The present application claims priority of Chinese Patent Application No. 201710209599.3 filed on Mar. 31, 2017 with SIPO, which is incorporated herein by reference in its entirety as a part of the present application.

TECHNICAL FIELD

Embodiments of the present disclosure relate to a transfer device, a transfer method and a vacuum evaporation device.

BACKGROUND

In the display field, it is generally necessary to form sequentially layer or film structures on a substrate in a vacuum atmosphere, so a transfer device is needed to transfer substrate to be formed with films.

For example, OLED (Organic Light Emitting Diode) display devices are widely applied due to their excellent characteristics, such as self-illumination, no backlight module, high contrast, high definition, wide viewing angle, complete solid state, applicability to flexible panels, good temperature feature, low power consumption, fast response speed and low manufacturing costs. The basic structure of an OLED display device includes an anode layer, functional layers and a cathode layer. The above-described functional layers may include a hole transfer layer, an organic illuminating layer and an electron transfer layer. The organic illuminating layer may be formed by various processes including an evaporation process, a molecular beam epitaxy process, an organic chemical vapor deposition process and a sol-gel process. The evaporation process is commonly applied to form functional layers, such as organic illuminating layer, due to its simple operation, easy control for film thickness, less pollution to film and easy doping. That is, in a vacuum atmosphere, organic materials are heated to be vaporized or sublimated and deposited on the substrate to form corresponding functional layers.

In the vacuum environment, stability for transferring substrate needs to be controlled by the friction force between the substrate and the transfer device. If the friction force between the substrate and the transfer device is too small, the substrate tends to slide or shift, thereby leading to non-precise alignment between layers, which in turn affects yield of the products. Further, friction tends to generate static electricity and also accumulate large amount of static electricity in the vacuum chamber with the progress of the transfer process. The existence of large amount of static electricity may cause debris from substrates, destroy circuits on the substrate or even damage masks.

SUMMARY

At least one embodiment of the present disclosure provides a transfer device comprising: at least one first transfer component; and at least one second transfer component. The first transfer component comprises a first carrier pad that contacts the transferred object, the second transfer component comprises a second carrier pad that contacts the transferred object; and material of the first carrier pad has stronger capability of capturing electrons than that of the second carrier pad, and material of the second carrier pad has stronger capability of losing electrons than that of the first carrier pad.

For example, in the transfer device provided by at least one embodiment of the present disclosure, the material of the first carrier pad has stronger capability of capturing electrons than the transferred object, and the material of the second carrier pad has stronger capability of losing electrons than the transferred object.

For example, in the transfer device provided by at least one embodiment of the present disclosure, the first transfer components and the second transfer components are disposed adjacently to each other, and an amount of positive charges of which all of the first carrier pads of the transfer device allow the transferred object to capture is approximately equal to an amount of negative charges of which all of the second carrier pads of the transfer device allows the transferred object to capture.

For example, in the transfer device provided by at least one embodiment of the present disclosure, the first transfer components and the second transfer components are disposed alternately, and an amount of positive charges of which all of the first carrier pads of the transfer device allow the transferred object to capture is approximately equal to an amount of negative charges of which all of the second carrier pads of the transfer device allow the transferred object to capture.

For example, in the transfer device provided by at least one embodiment of the present disclosure, an amount of positive charges of which the first carrier pads allow the transferred object to capture is approximately equal to an amount of negative charges of which the second carrier pads allow the transferred object to capture.

For example, in the transfer device provided by at least one embodiment of the present disclosure, the transfer device comprises a plurality of combination structures, the first transfer components and the second transfer components belong to a same combination structure, or belong to different combination structures, the transfer device comprises at least one first combination structure and at least one second combination structure, the first combination structure is composed of at least one of the first transfer components, and the second combination structure is composed of at least one of the second transfer components.

For example, in the transfer device provided by at least one embodiment of the present disclosure, the first combination structure and the second combination structure are disposed adjacently.

For example, in the transfer device provided by at least one embodiment of the present disclosure, the first combination structure and the second combination structure are disposed at an interval with each other.

For example, in the transfer device provided by at least one embodiment of the present disclosure, material of the transferred object is a glass substrate, material of the first carrier pad comprises bakelite, rosin, polytetrafluoroethylene or sulphur, and material of the second carrier pad comprises sheep skin, rubber or quartz.

For example, in the transfer device provided by at least one embodiment of the present disclosure, the first transfer component comprises at least one of a robot arm and a transfer platform; and the second transfer component comprises at least one of a robot arm and a transfer platform.

For example, in the transfer device provided by at least one embodiment of the present disclosure, an amount of positive charges of which the first transfer components allow the transferred object to capture is approximately equal to an amount of negative charges of which the second transfer components allow the transferred object to capture.

For example, in the transfer device provided by at least one embodiment of the present disclosure, an amount of positive charges of which the first transfer components allow the transferred object to capture is approximately equal to an amount of negative charges of which the second transfer components allow the transferred object to capture.

For example, in the transfer device provided by at least one embodiment of the present disclosure, the first transfer component comprises a first robot arm; and the second transfer component comprises a second robot arm. The first carrier pads are disposed on the first robot arm, and the second carrier pads are disposed on the second robot arm.

For example, in the transfer device provided by at least one embodiment of the present disclosure, the first transfer component further comprises a first transfer platform; and the second transfer component comprises a second transfer platform. Material of the upper surface of the first transfer platform and the material of the first carrier pads have same capability of capturing or losing electrons, and material of the upper surface of the second transfer platform and the material of the second carrier pads have same capability of capturing or losing electrons.

For example, in the transfer device provided by at least one embodiment of the present disclosure, material of the upper surface of the first transfer platform and the material of the first carrier pads are same or different, and material of the upper surface of the second transfer platform and the material of the second carrier pads are same or different.

For example, in the transfer device provided by at least one embodiment of the present disclosure, an amount of positive charges of which the first transfer platform and the first carrier pads allow the transferred object to capture is approximately equal to an amount of negative charges of which the second transfer platform and the second carrier pads allow the transferred object to capture.

For example, in the transfer device provided by at least one embodiment of the present disclosure, the first transfer component comprises a transfer platform; and the second transfer component comprises a robot arm. The first carrier pads are disposed on the transfer platform, and the second carrier pads are disposed on the robot arm.

For example, in the transfer device provided by at least one embodiment of the present disclosure, an amount of positive charges of which the first carrier pads allow the transferred object to capture is approximately equal to an amount of negative charges of which the second carrier pads allow the transferred object to capture.

At least one embodiment of the present disclosure also provides a vacuum evaporation device, comprising: any of the transfer devices; a vacuum evaporation chamber; and an evaporation source.

At least one embodiment of the present disclosure also provides a transfer method, comprising: transferring a transferred object by a first transfer component and a second transfer component. The first transfer component comprises a first carrier pad contacting the transferred object in transferring, and the second transfer component comprises a second carrier pad contacting the transferred object in transferring, and material of the first carrier pad has stronger capability to capture electrons than that of the second carrier pad, and material of the second carrier pad has stronger capability to lose electrons than that of the first carrier pad.

In the transfer method provided by at least one embodiment of the present disclosure, the transferred object is transferred sequentially by the first transfer component and the second transfer component, or is transferred in different stages by the first transfer component and the second transfer component.

In the transfer method provided by at least one embodiment of the present disclosure, the material of the first carrier pad has stronger capability of capturing electrons than the transferred object, and the material of the second carrier pad has stronger capability of losing electrons than the transferred object.

In the transfer method provided by at least one embodiment of the present disclosure, the first transfer component is used to drive the transferred object to rise and fall, rotate or translate horizontally; and the second transfer component is used to drive the transferred object to rise and fall, rotate or translate horizontally.

BRIEF DESCRIPTION TO THE DRAWINGS

To illustrate the technical solution of the embodiments of the present disclosure more clearly, the accompanied drawings of the embodiments will be briefly introduced below. It is apparent that the accompanied drawings as described below are only related to some embodiments of the present disclosure, but not limitative of the present disclosure.

DETAILED DESCRIPTION

Figure 1A:
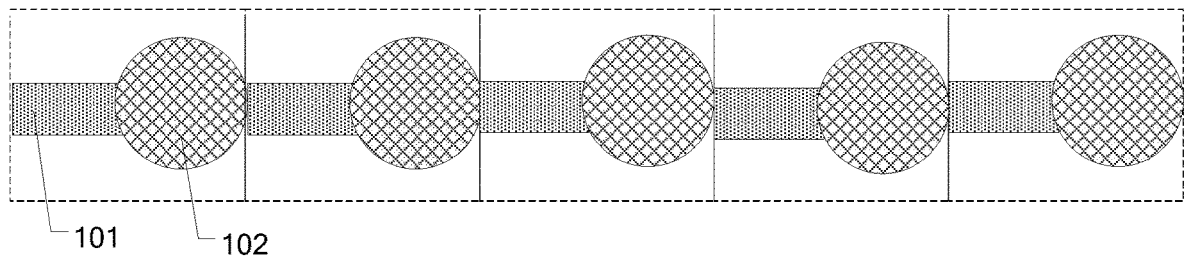
FIG. 1a is a schematically structural diagram of a transfer device provided in an embodiment of the present disclosure.

To allow objectives, technical solutions and advantages of embodiments of the present disclosure to be clearer, the technical solutions of the embodiments will be described in a clearly and fully understandable way in connection with the drawings related to the embodiments of the disclosure. It is apparent that the described embodiments are just a part but not all of the embodiments of the disclosure. Based on the described embodiments herein, a person of ordinary skill in the art can obtain other embodiment(s), without any creative work, which shall be within the scope of the disclosure.

Unless otherwise defined, all of the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

Generally, in the process of manufacturing electronic products, the electronic products to be formed will be transferred by the transfer device to form layer structures. In order to improve production efficiency, transfer speed is generally increased. While forming layer structures under a vacuum condition, friction force between the transfer device and the electronic products to be formed is needed to guarantee the stability of transferring of the electronic products. However, in the transfer process of the electronic products to be formed, the products might contact the transfer device, which inevitably results in static electricity which would cause various adverse affects.

For example, in the process of fabricating organic electroluminescent devices (OLEDs), evaporation apparatuses are usually adopted to deposit film layers and at the same time transfer devices are needed to transfer substrates on which films are to be formed. An evaporation apparatus often operates in a vacuum chamber. When a substrate is transferred in the vacuum chamber, the transfer component used in evaporation, such as a robotic arm, is not the one using vacuum absorption as in the atmosphere and the control over substrates entirely relies on frictional forces between, e.g., the robotic arm, and the substrate. However, sliding frictions tend to occur between the robotic arm and the substrate, which tend to generate static electricity, and position error caused by substrate sliding tends to cause debris or mis-alignment among layers. As the transfer process proceeds, large amount of static electricity would accumulates in the vacuum chamber which may cause debris of substrates in the organic electroluminescent devices, destroy circuits on the substrate and even damage masks.

The inventors of the present disclosure found out in research that it is possible to increase friction forces between the transfer component and the transferred objects and while decrease static electricity by changing the design of the part of the transfer component in the transfer device that contacts the transferred object. For example, it is possible to change the capability of capturing or losing electrons of the material of the part of the transfer component that contacts the transferred object or change the contact area between the transfer component and the transferred object to reduce the success rate reduction of alignment caused by the sliding of the transferred object, which in turn reduces the probability of debris generation. This can increase the transfer speed, and improve production efficiency and yield of the products.

Inventors of the present disclosure found out that it is possible to neutralize the static electricity on the transferred object by modifying the material of the transfer component at the location contacting the transferred object. The transfer path of the transferred object in the vacuum chamber may be very long and there may be many contact points between the transferred object and the transfer component accordingly. For example, it is possible to use a material that can easily capture electrons (as compared to the material of the transferred object) for the part of the front section of transfer component that contacts to guarantee the transferred object carries positive charges after friction. Before static electricity accumulates to the threshold of adverse effects, the material of the part of transfer component that contacts the transferred object is changed to one that easily lose electrons (as compared to the material of the transferred object). In this way, negative charges would be generated on the surface of the transferred object in the transfer process which can neutralize the accumulated positive charges previously to reduce effect of static electricity on the transferred object.

At least one embodiment of the present disclosure provides a transfer device. The transfer device includes at least one first transfer component including a first carrier pad contacting the transferred object and at least one second transfer component including a second carrier pad contacting the transferred object. The material of the first carrier pad has stronger capability to capture electrons than that of the second carrier pad and the material of the second carrier pad has stronger capability to lose electrons than that of the first carrier pad. In the present disclosure, the capability of capturing and losing electrons of material for the part of the transfer component that contacts the transferred object, such as the first carrier pad and/or the second carrier pad, is changed to reduce the success rate reduction of alignment caused by the sliding of the transferred object and reduce the probability of debris generation at the same time, which can increase the transfer speed of the transferred object, and improve production efficiency and yield of the products.

Figure 1B:
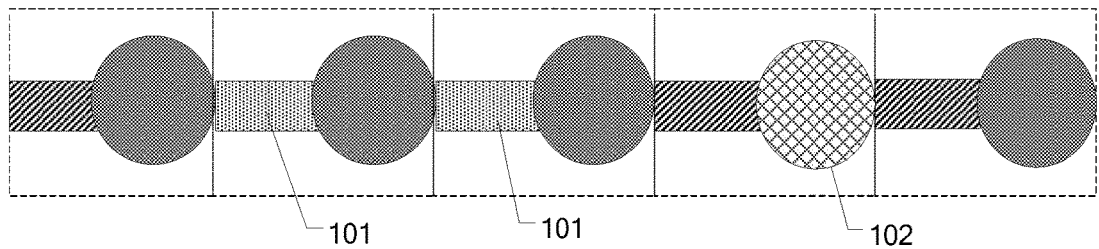
FIG. 1b is a schematically structural diagram of a transfer device provided in an embodiment of the present disclosure.
Figure 2:
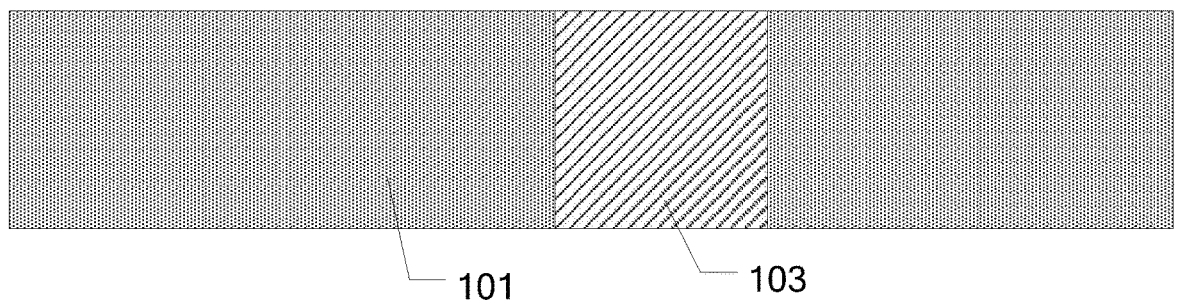
FIG. 2 is a schematically structural diagram of a first transfer component with a first carrier pad disposed thereon provided in an embodiment of the present disclosure.
Figure 3:
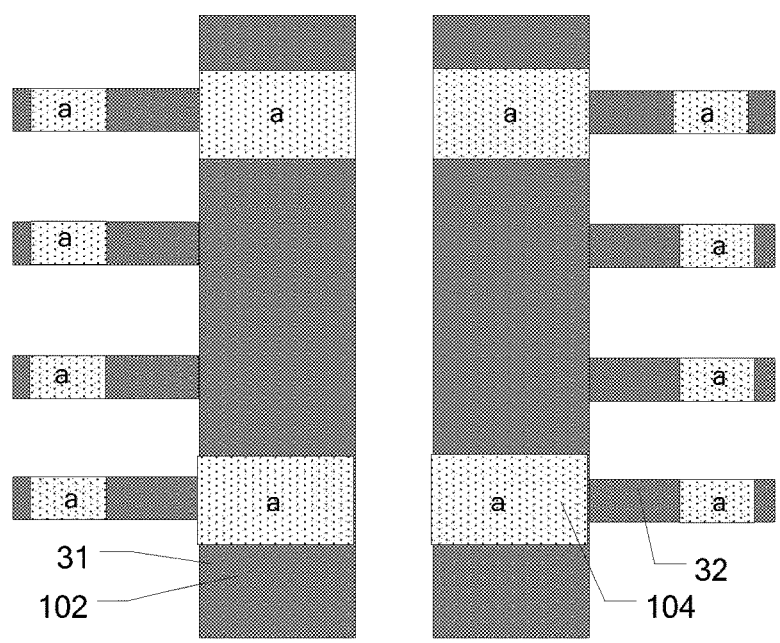
FIG. 3 is schematically structural diagram of a second transfer component with a second carrier pad disposed thereon provided in an embodiment of the present disclosure.

At least one embodiment of the present disclosure provides a transfer device. For example, FIG. 1a is a structure diagram of a transfer device provided in an embodiment of the present disclosure. As shown in FIG. 1a, the transfer device includes at least one first transfer component 101 and at least one second transfer component 102 disposed to be adjacent to each other. For example, FIG. 1b is a structure diagram of another transfer device provided in an embodiment of the present disclosure. As shown in FIG. 1b, the transfer device includes first transfer components 101 and second transfer components 102 disposed alternately. For example, FIG. 2 is a structure diagram of a first transfer component with a first carrier pad disposed thereon provided in an embodiment of the present disclosure. As shown in FIG. 2, the first transfer component 101 includes a first carrier pad 103 contacting the transferred object. For example, the transferred object is placed on the first carrier pad 103. For example, FIG. 3 is a structure diagram of a second transfer component with a second carrier pad disposed thereon provided in an embodiment of the present disclosure. As shown in FIG. 3, the second transfer component 102 includes a second carrier pad 104 contacting the transferred object. For example, the transferred object is placed on the second carrier pad 104. Referring to FIGS. 1a, 1b, 2 and 3 together, the material for the first carrier pad 103 has stronger capability of capturing electrons than that of the second carrier pad 104, and the material of the second carrier pad 104 has stronger capability of losing electrons than that of the first carrier pad 103.

It is to be noted that the first transfer component and the second transfer component shown in FIGS. 2 and 3 are only schematically structural diagrams and may have identical or different structures, which is not limited here. For example, both the first transfer component and the second transfer component may be of the same structure as shown in FIG. 2 or FIG. 3, or, the second transfer component may be configured as the structure as shown in FIG. 2, and the first transfer component may be configured as the structure as shown in FIG. 3.

For example, the body of the first transfer component 101 and the body of the second transfer component 102 are made of rigid material and not deformable. The bodies of the first transfer component 101 and the second transfer component 102 can support the transferred object well to guarantee the stability of the transferring of the object. The material of the first carrier pad 103 is different from that of the body of the first transfer component 101. The first carrier pad 103 contacts the transferred object, which avoids the direct contact between the body of first transfer component 101 and the transferred object. Similarly, the material of the second carrier pad 104 is different from that of the body of the second transfer component 102. The second carrier pad 104 contacts the transferred object, which avoids the direct contact between the body of second transfer component 102 and the transferred object. Materials for the first carrier pad 103 and the second carrier pad 104 may be selected flexibly as desired or replaced as desired, which enhance applicable range of the transfer device and decrease the costs of apparatus.

For example, the material of the first carrier pad 103 has stronger capability of capturing electrons than the transferred object, and the material of the second carrier pad 104 has stronger capability of losing electrons than the transferred object. In this way, it is possible that positive charges accumulate on the transferred object after it contacts the first carrier pad 103 and negative charges accumulate on it after it contacts the second carrier pad 104. The negative charges accumulated on the transferred object after contacting the second carrier pad 104 may be neutralized with the positive charges accumulated previoulsy to reduce damage to the transferred object by the static electricity.

For example, as shown in FIGS. 1a and 1b, the transfer device may include a plurality of first transfer components 101 and a plurality of second transfer components 102. In the entire transfer device, the first transfer components 101 and the second transfer components 102 may be disposed adjacently or alternately; or some of the first transfer components 101 and the second transfer components 102 are disposed adjacently and some of the first transfer components 101 and the second transfer components 102 are disposed alternately.

For example, as shown in FIGS. 1a, 1b, 2 and 3 together, when the first transfer component 101 and the second transfer component 102 are disposed adjacently, positive charges generated by the contact between the transferred object and the first carrier pad 103 on the first transfer component 101 are neutralized with the negative charges generated by the contact between the transferred object and the second carrier pad of the second transfer component 102, which reduces accumulation of the static electricity. When the first transfer component 101 and the second transfer component 102 are disposed alternately, the static electricity is neutralized before it is accumulated to a degree, as long as the accumulated static electricity amount is less than the minimum amount that leads to debris.

For example, in the entire transfer device, all of the first carrier pads 103 allow the transferred object with positive charge amount approximately to equal to the negative charge amount endowed by all of the second transfer components, so that the static electricity in the transfer device may be substantially neutralized finally, which reduces the static electricity accumulated in the vacuum chamber and adverse effects on the products by the static electricity.

It is to be noted that the electricity amount generated by the contact between the transferred object and each first carrier pad 103 and each second carrier pad 104 may be approximately identical or different. For example, the electricity amount generated by the contact between the transferred object and each first carrier pad 103 is x, the electricity amount generated by the contact between the transferred object and each second carrier pad 104 is y, and x=2y, then it is possible to provide second carrier pads 104 two times as many as the first carrier pads 103 in the entire transfer device such that all of the first carrier pads 103 in the transfer device endow the transferred object with a positive charge amount approximately equal to the negative charge amount endowed by all of the second carrier pads 104. For example, the first carrier pads 103 endow the transferred object with a positive charge amount approximately equal to the negative charge amount endowed by the second carrier pads 104. In this way, the first carrier pads 103 and the second carrier pads 104 may be disposed adjacently to control the accumulation of static electricity well.

It is to be noted that the amount of electricity generated by the contact between the transferred object and the first carrier pad 103 and/or the second carrier pad 104 is related not only to the capability of capturing or losing electrons of material of the first carrier pad 103 and the second carrier pad 104, but also to the contact area between the transferred object and the first carrier pad 103 and/or the second carrier pad 104. For example, when a contact of unit area between the first carrier pad 103 and the transferred object allows the transferred object to capture positive charges of amount n, a contact of unit area between the second carrier pad 104 and the transferred object allows the transferred object to capture negative charges of amount m, and m=2n, it is possible to set the contact area between the first carrier pad 103 and the transferred object to be a, set the contact area between the second carrier pad 104 and the transferred object to be b, and a=2b. Similarly, when the proportion relationship between the amount of positive charges of which a unit area of first carrier pad 103 allows the transferred object to capture and the amount of negative charges of which a unit area of second carrier pad 104 allows the transferred object to capture is known, it is possible to adjust areas of the first carrier pad 103 and the second carrier pad 104, accordingly, so that the first carrier pad 103 allows the transferred object to capture positive charges with an amount approximately equal to that of the negative charges of which the second carrier pad 104 allows the transferred object to capture.

For example, the part of the transfer component that contacts the transferred object (such as the first carrier pad and/or the second carrier pad) is designed to be plane-like rather than dot-like to reduce the damage to circuit by point discharge. For example, the area a in FIG. 2 is a plane-like area. Besides, the transfer device needs maintenance after a period of use, and the static electricity remaining on the transfer device may be removed by wiping.

Figure 4A:
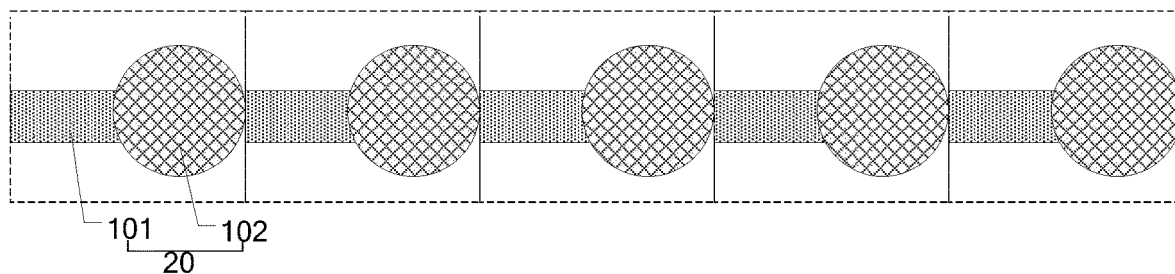
FIG. 4a is schematically structural diagram of another transfer device provided in an embodiment of the present disclosure.

For example, FIG. 4a is a structure diagram of another transfer device provided in an embodiment of the present disclosure. As shown in FIG. 4a, the transfer device includes a plurality of combination structures 20, and a first transfer component 101 and a second transfer component 102 belong to a same combination structure 20. For example, the plurality of combination structures 20 are disposed one by one. In each combination structure 20, the first carrier pad 103 on each first transfer component 101 allows the transferred object to capture positive charges of an amount substantially equal to that of the negative charges of which the second carrier pad 104 on each second transfer component 102 allows the transferred object to capture, such that the charges accumulated on the transferred object on one transfer component may be neutralized at least partially on the next transfer component. The amounts of positive charges and negative charges captured by the transferred object after being transferred through a plurality of combination structures 20 are substantially equal or such that the accumulated static electricity can be timely removed even if they are not equal to each other. In this way, the amount of static electricity accumulated is less than the minimum static electricity amount that cause debris, such that adverse effects caused by the static electricity can be reduced to a very low degree.

Figure 4B:
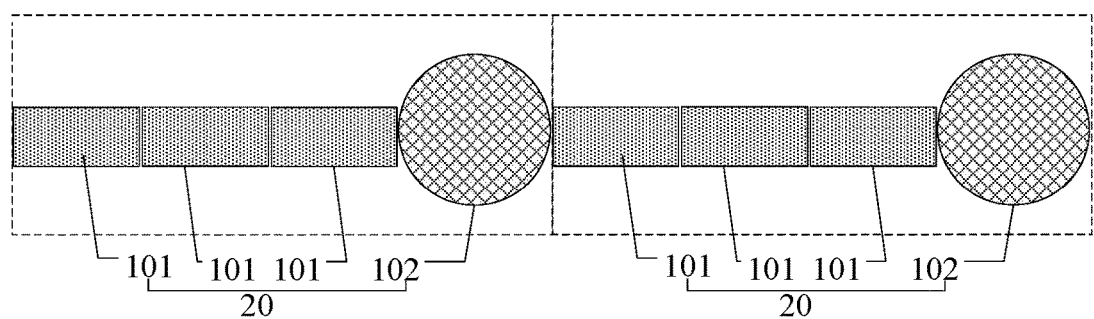
FIG. 4b is schematically structural diagram of another transfer device provided in an embodiment of the present disclosure.

For example, FIG. 4b is a structure diagram of another conveyor provided in an embodiment of the present disclosure. As shown in FIG. 4b, the transfer device includes a plurality of combination structures 20, and first transfer components 101 and a second transfer component 102 belong to a same combination structure 20. For example, the plurality of combination structures 20 are disposed one by one or adjacently. For example, the electricity amount generated by the contact between the transferred object and each first carrier pad 103 is x, the electricity amount generated by the contact between the transferred object and each second carrier pad 104 is y, and x=3y, then in each combination structure 20, the number of the contained first transfer components 101 is three times as many as that of the contained second transfer components 102, the first carrier pads 103 contained in a combination structure 20 allow the transferred object to capture positive charges of an amount substantially equal to that of the negative charges of which the second carrier pad 104 on the second transfer components 102 allows the transferred object to capture, such that the charges accumulated on the transferred object on one transfer component may be neutralized at least partially on the next transfer component. The amount of positive charges and the amount of the negative charges captured by the transferred object after being transferred through a plurality of combination structures 20 are substantially equal, or such that the accumulated static electricity can be timely removed even if they are not equal to each other. In this way, the amount of static electricity accumulated is less than the minimum static electricity amount that cause debris, such that adverse effects caused by static electricity may be reduced to a very low degree.

Figure 5:
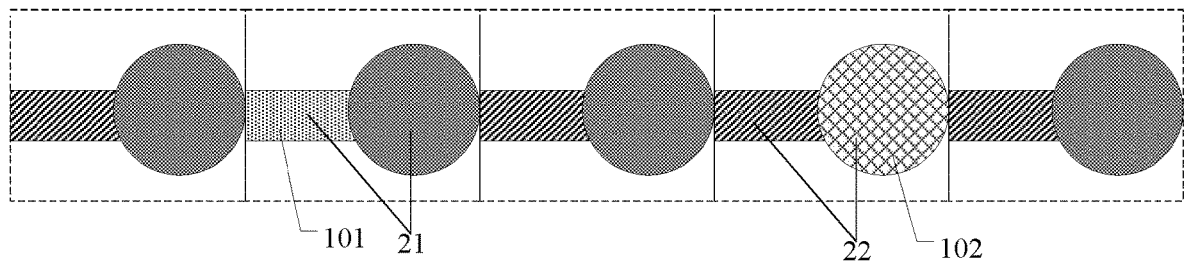
FIG. 5 is schematically structural diagram of yet another transfer device provided in an embodiment of the present disclosure.

For example, FIG. 5 is a structure diagram of another transfer device provided in an embodiment of the present disclosure. As shown in FIG. 5, the transfer device includes a plurality of combination structures, a first transfer component 101 and a second transfer component 102 belong to a first combination structure 21 and a second combination structure 22, respectively, a first carrier pad on the first transfer component 101 of the first combination structure 21 allows the transferred object to capture positive charges, and correspondingly, a second carrier pad on the second transfer component 102 of the second combination structure 22 allows the transferred object to capture negative charges. For example, with respect to the transferred object, carrier pads on other components located in the same combination structure as the first transfer component 101 may have the same or opposite capability of capturing or losing electrons as the first carrier pad, and carrier pads on other components located in the same combination structure as the second transfer component 102 may have the same or opposite capability of capturing or losing electrons as the second carrier pad. Generally, for the convenience of apparatus fabrication and guaranteeing the certainty that each combination structure allows the transferred object to capture or lose electrons, it is possible to set carrier pads on other components located in the same combination structure as the first transfer component to have the same capability of capturing or losing electrons as the first carrier pad or design them with the same material. It is to be noted that one combination structure may include only one transfer component, or may include a plurality of transfer components.

Figure 6:
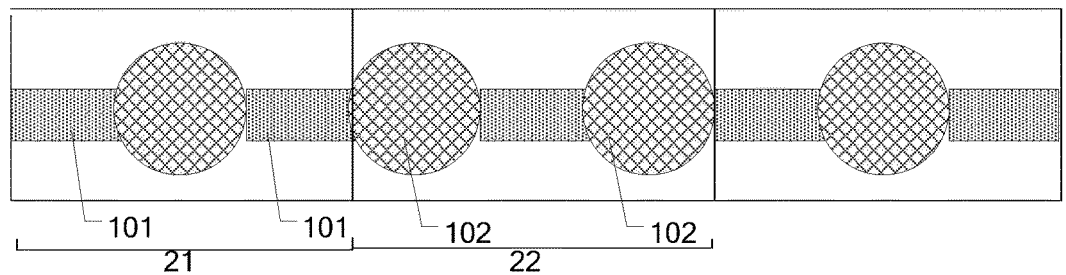
FIG. 6 is schematically structural diagram of yet another transfer device provided in an embodiment of the present disclosure.

For example, FIG. 6 is a structure diagram of another transfer device provided in an embodiment of the present disclosure. For example, the first combination structure 21 includes two first transfer components 101 disposed at interval. The second combination structure 22 includes two second transfer components 102 disposed at interval.

It is to be noted that, in the first combination structure 21, the two first transfer components 101 may also be disposed adjacently; or, the first combination structure 21 includes more first transfer components 101, which include an instance that the two first transfer components 101 are disposed adjacently and an instance that the two first transfer components 101 are disposed at interval.

Figure 7:
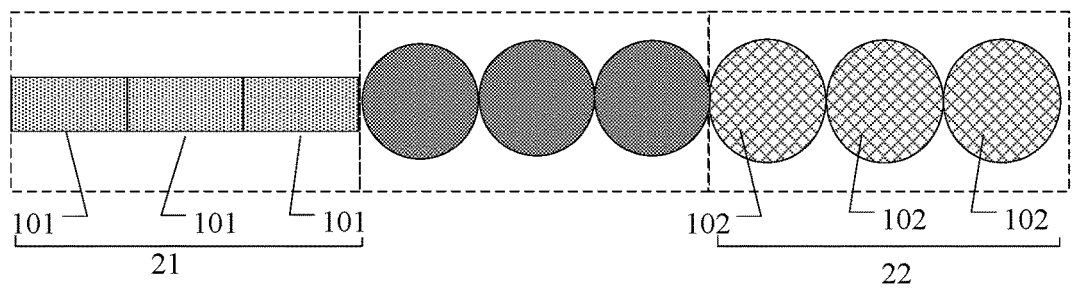
FIG. 7 is schematically structural diagram of yet another transfer device provided in an embodiment of the present disclosure.

For example, FIG. 7 is a structure diagram of another transfer device provided in an embodiment of the present disclosure. As shown in FIG. 7, the first combination structure 21 includes a plurality of first transfer components 101, and the second combination structure 22 includes a plurality of second transfer components 102. Exemplarily, both the transfer components 101 and the second transfer components 102 include the same element, such as a robotic arm. In order to simplify the manufacturing process of the transfer device, the first combination structure 21 may only include a plurality of first transfer components 101 each provided with a first carrier pad 103, and the second combination structure 22 may only include a plurality of second transfer components 102 each provided with a second carrier pad 104, as long as the amount of static electricity accumulated on the transferred object by the contact between the first carrier pads and the transferred object is less than the minimum static electricity amount that causes debris.

For example, the number of first transfer components contained in the first combination structure, the arrangement of first transfer components in the first combination structure, the number of second transfer components contained in the second combination structure, and the arrangement of second transfer components in the second combination structure are not limited to those as described above. As required, the numbers and arrangement of the first transfer components or the second transfer components may be adjusted, which will not be repeated here.

For example, as shown in FIG. 6, the first combination structure 21 and the second combination structure 22 are disposed adjacently.

As shown in FIG. 7, the first combination structure 21 and the second combination structure 22 are disposed at interval. In at least one embodiment of the present disclosure, it is also possible that first combination structures 21 and second combination structures 22 disposed adjacently and at interval are both included, which will not be repeated here.

For example, the first carrier pad 103 on the first transfer component 101 endows the transferred object with a positive charge amount approximately equal to the negative charge amount endowed by the second carrier pad 104 on the second transfer component 102. In this way, after each film layer is completed, the accumulated static electricity is substantially zero, which may reduce the adverse effect of the static electricity to a very low level.

For example, in at least one embodiment of the present disclosure, when the material of the transferred object is a glass substrate, the material for the first carrier pad includes those with the capability of capturing electrons with respect to glass, such as bakelite, rosin, polytetraflouroethylene or sulphur, and the material for the second carrier pad includes those with the capability of losing electrons with respect to glass, such as sheep skin, rubber or quartz.

It is to be noted that the material of transferred object may be any other material and the materials of the first and second carrier pads may be adjusted as desired as long as frictional forces are increased and the static electricity is neutralized to reduce adverse effect caused by the static electricity. For example, an approach for increasing the frictional forces may further include increasing coefficients of friction of the first and second carrier pads.

For example, the first transfer component includes at least one of a robot arm and a transfer platform; and the second transfer component includes at least one of a robot arm and a transfer platform.

For example, in an example, the first transfer component includes a first robotic arm or a conveyor belt, and the second transfer component includes a second robotic arm or a conveyor belt. Hereinbelow, the robotic arm will be described as an example, however, embodiments of the present disclosure are not limited to this specific structure. For example, the first carrier pad is disposed on the first robotic arm, and the second carrier pad is disposed on the second robotic arm. FIG. 3 may be referred to for the structure diagram of the first and second robotic arms.

For example, the first robotic arm and the second robotic arm may transfer a plate-like product, such as a glass substrate, among vacuum chambers. For example, the first robotic arm may remove the glass substrate from the first vacuum chamber and put it in a second vacuum chamber for film formation process, such as evaporation, by raising, lowering, rotating or displacing it; and the second robotic arm may remove the glass substrate from the second vacuum chamber and put it in a third vacuum chamber for another film formation process, such as evaporation, by raising, lowering, rotating or displacing it.

For example, the structure shown in FIG. 3 may be the first robotic arm or the second robotic arm. The first robotic arm and the second robotic arm each includes a main supporting arm 31 and a secondary supporting arm 32 disposed on at least one side of the main supporting arm 31.

For example, the robot arm (e.g., the first robotic arm or the second robotic arm) includes at least two secondary supporting arms 32 disposed parallel to each other or symmetrically about the main supporting arm 31, and the extension lengths of secondary supporting arms 32 are equal to each other. As shown in FIG. 3, the robotic arm includes a main supporting arm 31 and eight secondary supporting arms 32 disposed symmetrically on the two sides of the main supporting arm 31.

It is to be noted that the arrangement of the secondary supporting arms 32 in the robot arm may be adjusted as desired as long as they can support the transferred object in a plane and stably, which are not limited here.

For example, each of the first robotic arm and the second robotic arm includes an elevating structure, a rotating structure and a horizontally telescoping structure to allow the first and second robotic arms to acquire the transferred object and transfer the transferred object into the vacuum evaporation chamber.

For example, in this example, the transfer device may further include a first motor that drives the first robotic arm and/or the second robotic arm to rise and fall; a second motor that drives the first robotic arm and/or the second robotic arm to rotate; and a third motor that drives the first robotic arm and/or the second robotic arm to telescope (stretch out and draw back) horizontally.

For example, in yet another example, the first transfer component includes a transfer platform, the second transfer component includes a robotic arm, the first carrier pad is disposed on the transfer platform and the second carrier pad is disposed on the robotic arm.

For example, the first carrier pad endows the transferred object with a positive charge amount approximately equal to the negative charge amount endowed by the second carrier pad. In this way, the amount of the static electricity accumulated on the transferred object is substantially zero after the transferred object is transferred through a transfer platform and a robotic arm.

In at least one embodiment of the present disclosure, the capability of relatively capturing and losing electrons of material for the part of the transfer component that contacts the transferred object, such as the first carrier pad, the second carrier pad, and the combination of the first and second carrier pads, is changed to neutralize more static electricity generated by the increased friction and reduce the success rate reduction of alignment caused by the sliding of the transferred object due to the too small friction previously and reduce the probability of debris generation at the same time. This can reduce adverse effect by the static electricity while guaranteeing enough friction force, thereby increasing the transfer speed of the transferred object, and improving production efficiency and yield of the products.

Figure 8:
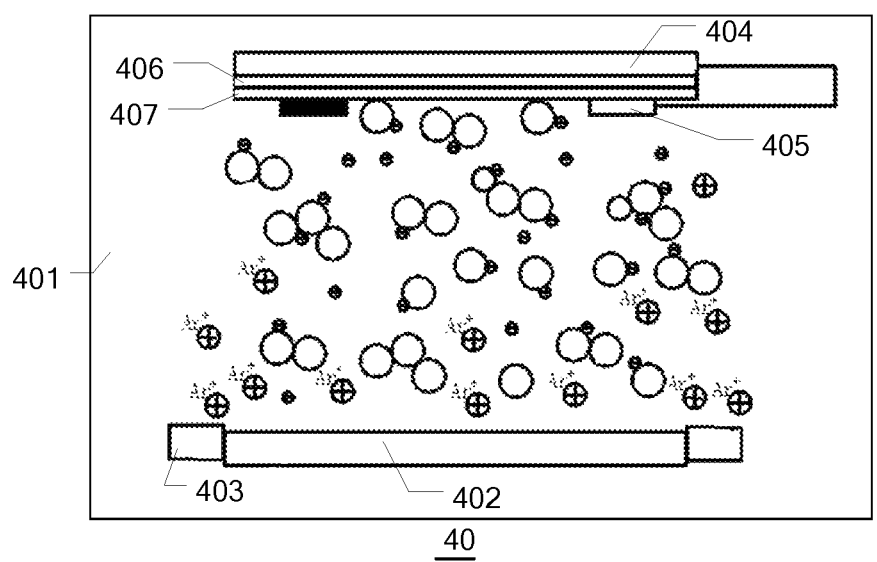
FIG. 8 is a schematically structural cross-section view of a vacuum evaporation device provided in an embodiment of the present disclosure.

At least one embodiment of the present disclosure also provides a vacuum evaporation device 40, as shown in FIG. 8, which includes any one of the above-described transfer devices and further includes an vacuum evaporation chamber 401 and an evaporation source 402 disposed in the vacuum evaporation chamber 401.

For example, the vacuum evaporation chamber 401 is further provided with an evaporation base (not shown) for placing the substrate to be evaporated. The evaporation source 402 has an opening towards the evaporation base and may be a linear evaporation source.

For example, the vacuum evaporation apparatus further includes a cathode 403 disposed on the side of the evaporation source 402, an anode disposed on the side of the evaporation base, and an inert gas supply device for feeding an inert gas into the vacuum evaporation chamber 401.

For example, the vacuum evaporation apparatus may further include a magnetic plate 406 disposed at a side of the substrate 407 that is opposite to that of the evaporation source 402, on which the anode 404 is disposed.

For example, the vacuum evaporation apparatus further includes a mask 405 disposed on the side of the substrate 407 that is opposite to that of the evaporation source 402, the mask 405 is connected with the anode 404 via wires.

For example, a vacuum evaporation process by the vacuum evaporation apparatus 40 includes: evacuating the evaporation chamber to a high vacuum state and feeding inert gas into the evaporation chamber with by an inert gas supply device; transferring the substrate to be evaporated into the vacuum evaporation chamber by the transfer device; generating a high frequency electric field between the anode and the cathode to ionize the inert gas to generate ions and electrons of the inert gas; and heating the evaporation source such that the evaporated substance to be formed as a film can absorb electrons and moves to the anode so as to form a film on the surface of the substrate.

At least one embodiment of the present disclosure also provides a transfer method including following operations.

S101, transferring the transferred object by the first transfer component.

S102, transferring the transferred object by the second transfer component. The first transfer component includes a first carrier pad contacting the transferred object in transferring, and the second transfer component includes a second carrier pad contacting the transferred object in transferring, and the material of the first carrier pad has stronger capability to capture electrons than that of the second carrier pad, and the material of the second carrier pad has stronger capability to lose electrons than that of the first carrier pad. For example, the material of the first carrier pad has stronger capability of capturing electrons than the transferred object, and the material of the second carrier pad has stronger capability of losing electrons than the transferred object. In this way, it is possible that positive charges are generated on the transferred object after it contacts the first carrier pad and negative charges are generated on it after it contacts the second carrier pad. The negative charges generated on the transferred object after contacting the second carrier pad may be neutralized with the positive charges generated previously to reduce damage to the transferred object by the static electricity.

The transfer method may also include following operations.

S201, transferring the transferred object by the second transfer component.

S202, transferring the transferred object by the first transfer component. The first transfer component includes a first carrier pad contacting the transferred object in transferring, and the second transfer component includes a second carrier pad contacting the transferred object in transferring, and the material of the first carrier pad has stronger capability to capture electrons than that of the second carrier pad, and the material of the second carrier pad has stronger capability to lose electrons than that of the first carrier pad. For example, the material of the first carrier pad has stronger capability of capturing electrons than the transferred object, and the material of the second carrier pad has stronger capability of losing electrons than the transferred object.

For example, in the transfer method provided in at least one embodiment of the present disclosure, the transferred object is transferred sequentially by the first and second transfer components, or the transferred object is transferred in different stages by the first and second transfer components, respectively.

For example, when the transferred object is transferred sequentially by first transfer component and the second transfer component, the positive charges generated by the contact between the transferred object and the first carrier pad on the first transfer component may be neutralized with the negative charges generated by the contact between the transferred object and the second carrier pad on the second transfer component, which reduces the accumulation of the static electricity and the possibility of debris caused by the static electricity accumulation.

For example, when the transferred object is transferred by the first transfer component and the second transfer component in different stages, the static electricity is neutralized before it is accumulated to a certain degree, as long as the accumulated static electricity is less than the minimum static electricity that causes debris. In this way, the first transfer component and the second transfer component may reduce the complexity in the preparation process of the transfer device.

For example, in the transfer method provided in at least one embodiment of the present disclosure, the first transfer component and the second transfer component belong to a same combination structure or different combination structures. For example, carrier pads on other components located in the same combination structure as the first transfer component have the same or opposite capability of capturing or losing electrons as the first carrier pad, and carrier pads on other components located in the same combination structure as the second transfer component have the same or opposite capability of capturing or losing electrons as the second carrier pad.

It is to be noted that a combination structure may include only one transfer component, or may include a plurality of transfer components.

For example, the first combination structure consists of at least one first transfer component, and the second combination structure consists of at least one second transfer component. For example, the first combination structure includes two first transfer components that may be disposed adjacently or at interval. The second combination structure includes two second transfer components that may be disposed adjacently or at interval.

For example, in order to simplify the manufacturing process of the transfer device, the first combination structure may only include a plurality of first transfer components each provided with a first carrier pad, and not include other components, and the second combination structure may only include a plurality of second transfer components each provided with a second carrier pad, and not include other components, as long as the amount of static electricity accumulated on the transferred object by the contact between the first carrier pad and the transferred object is less than the minimum static electricity amount that causes debris.

For example, the number of first transfer components contained in the first combination structure, the arrangement of first transfer components in the first combination structure, the number of second transfer components contained in the second combination structure, and the arrangement of second transfer components in the second combination structure are not limited to those have been described above. As required, the number and the arrangement of the first transfer components or the number and the arrangement of the second transfer components can be adjusted, which will not be described here.

For example, the first combination structure and the second combination structure can be disposed adjacently, or at interval, or the first combination structures and the second combination structures are disposed adjacently and at interval.

For example, the material of the first carrier pad has stronger capability of capturing electrons than the transferred object, and the material of the second carrier pad has stronger capability of losing electrons than the transferred object.

For example, in the transfer method provided in at least one embodiment of the present disclosure, when the transferred object is a glass substrate, the first transfer component is used to drive the glass substrate to rise and fall, rotate or translate horizontally; and the second transfer component is used to drive the glass substrate to rise and fall, rotate or translate horizontally. For example, the first transfer component may remove the glass substrate from the first vacuum chamber and put it in a second vacuum chamber for film formation process, such as evaporation, by raising, lowering, rotating or displacing it; and the second transfer component may remove the glass substrate from the first vacuum chamber and put it in a third vacuum chamber for another film formation process, such as evaporation, by raising, lowering, rotating or displacing it.

The transfer device, transfer method and the vacuum evaporation device provided in at least one embodiment of the present disclosure have the following beneficial effects:

(1) With the transfer device provided in at least one embodiment of the present disclosure, the capability of relatively capturing and losing electrons of material for the part of the transfer component that contacts the transferred object, such as the first carrier pad, the second carrier pad and the combination of the first and second carrier pads, is changed to neutralize more static electricity generated by the increased friction.

(2) With the transfer device provided in at least one embodiment of the present disclosure, it is possible to reduce the success rate reduction of alignment caused by the of the transferred object due to small friction force previously, which can in turn reduce adverse effects by the static electricity while guaranteeing enough frictional force.

(3) The transfer device provided in at least one embodiment of the present disclosure may reduce the probability of debris generation and in turn improving yield of the products.

(4) The transfer device provided in at least one embodiment of the present disclosure may speed up the transferring of the transferred object and improving efficiency of production.

(5) In the transfer device provided in at least one embodiment of the present disclosure, materials of the first carrier pad and the second carrier pad may be selected flexibly as desired or replaced as desired, which enhance applicable range of the transfer device and reduce the costs of apparatus.

The following points need to be noted:

(1) The accompanying drawings in the embodiments of the present disclosure only involve structures relevant to the embodiments of the present disclosure, and other structures may refer to a common design.

(2) For clarity, in the accompanying drawings of the embodiments of the present disclosure, the thickness of layers or regions is enlarged or reduced. That is, the accompanying drawings are not drawn according to actual scales and actual shapes.

(3) Without conflict, the embodiments of the present disclosure and the features in the embodiments can be combined with each other to obtain new embodiments.

The described above are only specific embodiments of the present disclosure, and the present disclosure is not intended to be limited thereto. The scope of the present disclosure is defined by the claims.

What is claimed is:

1. A transfer device comprising:
   at least one first transfer component; and
   at least one second transfer component;
   wherein the first transfer component comprises a first carrier pad that contacts a transferred object, the second transfer component comprises a second carrier pad that contacts the transferred object; and
   material of the first carrier pad has stronger capability of capturing electrons than that of the second carrier pad, and material of the second carrier pad has stronger capability of losing electrons than that of the first carrier pad.

2. The transfer device according to claim 1, the material of the first carrier pad has stronger capability of capturing electrons than the transferred object, and the material of the second carrier pad has stronger capability of losing electrons than the transferred object.

3. The transfer device according to claim 1, wherein the at least one first transfer components and the at least one second transfer components are disposed adjacently to each other, and an amount of positive charges of which all of the first carrier pads of the transfer device allow the transferred object to capture is approximately equal to an amount of negative charges of which all of the second carrier pads of the transfer device allows the transferred object to capture.

4. The transfer device according to claim 1, wherein the at least one first transfer components and the at least one second transfer components are disposed alternately, and an amount of positive charges of which all of the first carrier pads of the transfer device allow the transferred object to capture is approximately equal to an amount of negative charges of which all of the second carrier pads of the transfer device allow the transferred object to capture.

5. The transfer device according to claim 2, wherein an amount of positive charges of which the first carrier pads allow the transferred object to capture is approximately equal to an amount of negative charges of which the second carrier pads allow the transferred object to capture.

6. The transfer device according to claim 5, wherein a part of the first transfer component that contacts the transferred object is configured as a plane; and a part of the second transfer component that contacts the transferred object is configured as a plane.

7. The transfer device according to claim 5, wherein the first transfer component comprises at least one of a robot arm and a transfer platform; and the second transfer component comprises at least one of a robot arm and a transfer platform.

8. The transfer device according to claim 1, wherein material of the transferred object is a glass substrate, the material of the first carrier pad comprises bakelite, rosin, polytetrafluoroethylene or sulphur, and the material of the second carrier pad comprises sheep skin, rubber or quartz.

9. A vacuum evaporation device, comprising, a transfer device, wherein the transfer device comprises:
   at least one first transfer component; and
   at least one second transfer component;
   wherein the first transfer component comprises a first carrier pad that contacts a transferred object, the second transfer component comprises a second carrier pad that contacts the transferred object; and
   material of the first carrier ad has stronger capability of capturing electrons than that of the second carrier pad, and material of the second carrier pad has stronger capability of losing electrons than that of the first carrier pad.

10. A transfer method, comprising:
   transferring a transferred object by a first transfer component and a second transfer component;
   wherein the first transfer component comprises a first carrier pad contacting the transferred object in transferring, and the second transfer component comprises a second carrier pad contacting the transferred object in transferring, and material of the first carrier pad has stronger capability to capture electrons than that of the second carrier pad and material of the second carrier pad has stronger capability to lose electrons than that of the first carrier pad.

11. The transfer method according to claim 10, wherein the transferred object is transferred sequentially by the first transfer component and the second transfer component or is transferred in different stages by the first transfer component and the second transfer component.

12. The transfer method according to claim 11, wherein the material of the first carrier pad has stronger capability of capturing electrons than the transferred object, and the material of the second carrier pad has stronger capability of losing electrons than the transferred object.

13. The transfer method according to claim 10, wherein
the first transfer component is used to drive the transferred object to rise and fall, rotate or translate horizontally; and
the second transfer component is used to drive the transferred object to rise and fall, rotate or translate horizontally.

14. The transfer device according to claim 1, wherein the first transfer component
comprises at least one of a robot arm and a transfer platform; and the second transfer component comprises at least one of a robot arm and a transfer platform.

15. The transfer device according to claim 1, wherein the first transfer component comprises a first robot arm, and the second transfer component comprises a second robot arm, the first carrier pad being disposed on the first robot arm, and the second carrier pad being disposed on the second robot arm.

16. The transfer device according to claim 15, wherein the first transfer component further comprises a first transfer platform; and the second transfer component further comprises a second transfer platform, material of an upper surface of the first transfer platform and the material of the first carrier pads having same capability of capturing or losing electrons, and material of an upper surface of the second transfer platform and the material of the second carrier pads have same capability of capturing or losing electrons.

17. The transfer device according to claim 16, wherein the material of the upper surface of the first transfer platform and the material of the first carrier pad are same, and the material of the upper surface of the second transfer platform and the material of the second carrier pad are same.

18. The transfer device according to claim 17, wherein an amount of positive charges of which the first transfer platform and the first carrier pad allow the transferred object to capture is approximately equal to an amount of negative charges of which the second transfer platform and the second carrier pad allow the transferred object to capture.

19. The transfer device according to claim 1, wherein the first transfer component comprises a transfer platform, and the second transfer component comprises a robot arm, the first carrier pad being disposed on the transfer platform, and the second carrier pad being disposed on the robot arm.

* * * * *